US008850292B2

(12) United States Patent
Lee

(10) Patent No.: US 8,850,292 B2
(45) Date of Patent: Sep. 30, 2014

(54) FLASH MEMORY SYSTEM AND READ METHOD IN FLASH MEMORY SYSTEM

(71) Applicant: Samsung Electronics Co., Ltd., Suwon-si (KR)

(72) Inventor: Sang-hoon Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 33 days.

(21) Appl. No.: 13/656,849

(22) Filed: Oct. 22, 2012

(65) Prior Publication Data

US 2013/0139036 A1 May 30, 2013

(30) Foreign Application Priority Data

Nov. 24, 2011 (KR) ........................ 10-2011-0123662

(51) Int. Cl.
*G11C 29/00* (2006.01)

(52) U.S. Cl.
USPC .... 714/773; 711/103; 365/185.09; 365/185.2

(58) Field of Classification Search
CPC .............. G11C 2211/5621; G11C 2211/5624; G11C 16/00; G11C 16/04
USPC ............ 714/773; 711/103; 365/185.09, 185.2
See application file for complete search history.

(56) References Cited

U.S. PATENT DOCUMENTS

| 2008/0123419 | A1* | 5/2008 | Brandman et al. ........ 365/185.09 |
| 2008/0126686 | A1* | 5/2008 | Sokolov et al. ............... 711/103 |
| 2008/0244359 | A1 | 10/2008 | Li et al. |
| 2009/0070521 | A1* | 3/2009 | Gorobets et al. ............. 711/103 |
| 2010/0162084 | A1* | 6/2010 | Coulson et al. ............... 714/773 |
| 2012/0163074 | A1* | 6/2012 | Franca-Neto et al. ...... 365/185.2 |
| 2013/0073924 | A1* | 3/2013 | D'Abreu et al. ............. 714/763 |

FOREIGN PATENT DOCUMENTS

| KR | 10-2009-0085523 A | 8/2009 |
| KR | 10-2009-0126829 A | 12/2009 |
| KR | 10-2010-0119502 A | 11/2010 |

* cited by examiner

*Primary Examiner* — Sam Rizk
(74) *Attorney, Agent, or Firm* — Myers Bigel Sibley & Sajovec, PA

(57) ABSTRACT

Methods of operating nonvolatile memory devices include reading a first plurality of multi-bit nonvolatile memory cells in the nonvolatile memory device using a first plurality of read voltages to thereby generate first read data, and then rereading the first plurality of multi-bit nonvolatile memory cells using a second plurality of read voltages that differ, at least in part, from the first plurality of read voltages, to thereby generate second read data. An operation is then undertaken to perform first and second ECC decoding operations on the first and second read data, respectively, to thereby identify whether the first read data or the second read data more accurately reflects data stored in the first plurality of multi-bit nonvolatile memory cells during the reading and rereading.

19 Claims, 17 Drawing Sheets

| Index | RLEV1 | RLEV2 | RLEV3 |
|---|---|---|---|
| 0 | RV11 | RV12 | RV13 |
| 1 | RV21 | RV22 | RV23 |
| 2 | RV31 | RV32 | RV33 |
| ⋮ | ⋮ | ⋮ | ⋮ |
| n | RVn1 | RVn2 | RVn3 |

RTAB

FIG. 11

| Read Level Table | Field0 | Field1 | Field2 | Field3 | Field4 | Field5 | Field6 | Field7 | No. |
|---|---|---|---|---|---|---|---|---|---|
| Initial Read | Uncor. | Uncor. | | Uncor. | Uncor. | Uncor. | Uncor. | | |
| Table Index1 | Correct | Uncor. | | Correct | Uncor. | Uncor. | Uncor. | | 2Hit |
| Table Index2 | Correct | Uncor. | | Correct | Correct | Correct | Uncor. | | 4Hit |
| Table Index3 | Correct | Correct | | Correct | Correct | Correct | Uncor. | | 5Hit |
| Table Index4 | Uncor. | Uncor. | | Correct | Uncor. | Uncor. | Correct | | 2Hit |

FIG. 13

| Read Level Table | Field0 | Field1 | Field2 | Field3 | Field4 | Field5 | Field6 | Field7 | No. |
|---|---|---|---|---|---|---|---|---|---|
| Initial Read | Uncor. | Uncor. | | Uncor. | Uncor. | Uncor. | Uncor. | | |
| Table Index1 | Correct | Uncor. | | Correct | Uncor. | Uncor. | Uncor. | | 2Hit |
| Table Index2 | Correct | Uncor. | | Correct | Correct | Correct | Correct | | 5Hit |
| Table Index3 | Correct | Correct | | Correct | Correct | Correct | Uncor. | | 5Hit |
| Table Index4 | Uncor. | Uncor. | | Correct | Uncor. | Uncor. | Correct | | 2Hit |

WTAB

| Block Address | WO | LInd |
|---|---|---|
| a-1 | 7 | 3 |
| ⋮ | ⋮ | ⋮ |
| 1 | 2 | 1 |
| 0 | 4 | 0 |

FIG. 16

RTABA

| Index | RLEV1 | RLEV2 | RLEV3 |
|---|---|---|---|
| 0 | RV11 | RV12 | RV13 |
| 1 | RV21 | RV22 | RV23 |
| 2 | RV31 | RV32 | RV33 |
| ⋮ | ⋮ | ⋮ | ⋮ |
| n | RVn1 | RVn2 | RVn3 |

RTABB

| Index | RLEV1 | RLEV2 | RLEV3 |
|---|---|---|---|
| 0 | RV11 | RV12 | RV13 |
| 1 | RV21 | RV22 | RV23 |
| 2 | RV31 | RV32 | RV33 |
| ⋮ | ⋮ | ⋮ | ⋮ |
| n | RVn1 | RVn2 | RVn3 |

RTABC

| Index | RLEV1 | RLEV2 | RLEV3 |
|---|---|---|---|
| 0 | RV11 | RV12 | RV13 |
| 1 | RV21 | RV22 | RV23 |
| 2 | RV31 | RV32 | RV33 |
| ⋮ | ⋮ | ⋮ | ⋮ |
| n | RVn1 | RVn2 | RVn3 |

FLASH MEMORY SYSTEM AND READ METHOD IN FLASH MEMORY SYSTEM

REFERENCE TO PRIORITY APPLICATION

This application claims priority to Korean Patent Application No. 10-2011-0123662, filed Nov. 24, 2011, the disclosure of which is hereby incorporated herein by reference.

FIELD

This invention relates to flash memory systems and read methods in flash memory systems and, more particularly, to flash memory systems that may improve read reliability by correcting read errors quickly and read methods in flash memory systems.

BACKGROUND

As flash memory systems become highly integrated, they are scaled down and the number of bits stored in each memory cell is increased. Thus, a read margin between program states decreases. Thus, read errors occur frequently, and methods of correcting the read errors precisely and quickly have been studied.

SUMMARY

Methods of operating nonvolatile memory devices according to embodiments of the invention include reading a first plurality of multi-bit nonvolatile memory cells in the nonvolatile memory device using a first plurality of read voltages to thereby generate first read data, and then rereading the first plurality of multi-bit nonvolatile memory cells using a second plurality of read voltages that differ, at least in part, from the first plurality of read voltages, to thereby generate second read data. An operation is then undertaken to perform first and second ECC decoding operations on the first and second read data, respectively, to thereby identify whether the first read data or the second read data more accurately reflects data stored in the first plurality of multi-bit nonvolatile memory cells during the reading and rereading. According to some of these embodiments of the invention, the step of performing first ECC decoding operations on the first read data is performed concurrently with the rereading. According to additional embodiments of the invention, the values of the first plurality of read voltages and the values of the second plurality of read voltages are stored as first and second indexes, respectively, within a read retry table, which may be stored in the nonvolatile memory device.

Moreover, the performing first ECC decoding operations may include comparing a number of sectors having errors within the first read data against a number of sectors having errors within the second read data. This comparing operation may include determining average iterations associated with the performing first and second ECC decoding operations in the event the number of sectors having errors within the first read data is equivalent to the number of sectors having errors within the second read data. Operations may also be performed to update at least one of the first and second indexes in the read retry table in response to an update in wear information stored within a wear-out table. According to still further embodiments of the invention, an additional operation may be performed to reread the first plurality of multi-bit nonvolatile memory cells using a third plurality of read voltages that differ, at least in part, from the first plurality of read voltages and from the second plurality of read voltages, to thereby generate third read data, in response to detecting an excessive number of errors in the first and second read data during the performing first and second ECC decoding operations on the first and second read data.

According to another aspect of the inventive concept, a read method in a memory system including a NAND flash memory including a buffer unit having a plurality of latches and a memory controller for controlling the NAND flash memory to read data from the NAND flash memory, the method includes: transmitting first data that is read at a read level included in a first index among indexes of a read retry table to a second latch via a first latch among the plurality of latches; performing error check and correction (ECC) decoding on the first data transmitted to the second latch while second data that is read at a read level included in a second index among the indexes of the read retry table is transmitted to the first latch; transmitting the second data from the first latch to the second latch and performing ECC decoding on the second data transmitted to the second latch; and performing soft decision at one of the read level at which the first data is read and the read level at which the second data is read, by comparing an ECC decoding result of the first data with an ECC decoding result of the second data.

Each of the ECC decoding result of the first data and the ECC decoding result of the second data may include the number of ECC sectors that are corrected from the first data by performing ECC decoding on the first data and the number of ECC sectors that are corrected from the second data by performing ECC decoding on the second data.

The performing of the soft decision at one of the read level at which the first data is read and the read level at which the second data is read may include selecting the read level of the soft decision based on the number of corrected ECC sectors regarding each of the first data and the second data.

The performing of the soft decision at one of the read level at which the first data is read and the read level at which the second data is read may include, when the number of ECC sectors corrected from the first data and the number of ECC sectors corrected from the second data are the same, selecting the read level for the soft decision based on the number of average iteration regarding each of the first data and the second data.

Each of ECC decoding on the first data and ECC decoding on the second data may be performed in all fields of the first data and in all fields of the second data.

The method may further include: performing ECC decoding on pieces of data that are read at read levels of the other indexes of the read retry table; and performing the soft decision at a read level that is selected based on the ECC decoding result of the first data, the ECC decoding result of the second data, and an ECC decoding result of the pieces of data that are read at read levels of the other indexes of the read retry table.

The performing of ECC decoding on pieces of data that are read at read levels of the other indexes of the read retry table may include performing ECC decoding on data stored in the second latch via the first latch while one of the pieces of data is transmitted to the first latch.

The read method may be performed when a read error during initial read is not corrected by performing read retry.

The method may further include: setting a read level included in one of the indexes of the read retry table to a read level for starting the read retry by referring to a wear-out table in which each of the blocks of the flash memory is used as an index; and repeatedly performing the read retry at read levels in a range from the read level for starting the read retry to the last read level of the last index of the read retry table.

The read retry table may be selected from read retry tables that are differently provided for each endurance state period of the flash memory.

The wear-out table may update wear-out information regarding a first block of the flash memory based on state information that is detected from the flash memory in response to a first command transmitted from the memory controller.

The read level for starting the read retry at a current request of read retry on the first block of the flash memory may include a read level of which a read error is corrected at a previous request of read retry on the first block of the flash memory.

Information regarding an index including a read level of which a read error is corrected at the previous request of read retry among the indexes of the read retry table may be included in an index corresponding to the first block of the wear-out table.

The first command may include an erase command, and the flash memory may transmit an incremental step pulse erase (ISPE) loop count value that is required for erasing a selected block in response to the erase command and that is represented as wear-out of the selected block, to the memory controller.

According to another aspect of the inventive concept, a solid state drive (SSD) performs a data read operation by using the read method.

BRIEF DESCRIPTION OF THE DRAWINGS

Exemplary embodiments of the inventive concept will be more clearly understood from the following detailed description taken in conjunction with the accompanying drawings in which:

FIGS. 11 and 12 illustrate the read method illustrated in FIG. 1 in detail;

FIG. 13 illustrates a different example from that of FIG. 11;

FIGS. 14 through 16 illustrate settings of read levels at which read retry starts, according to exemplary embodiments of the inventive concept, respectively;

DETAILED DESCRIPTION OF THE EMBODIMENTS

Figure 1:
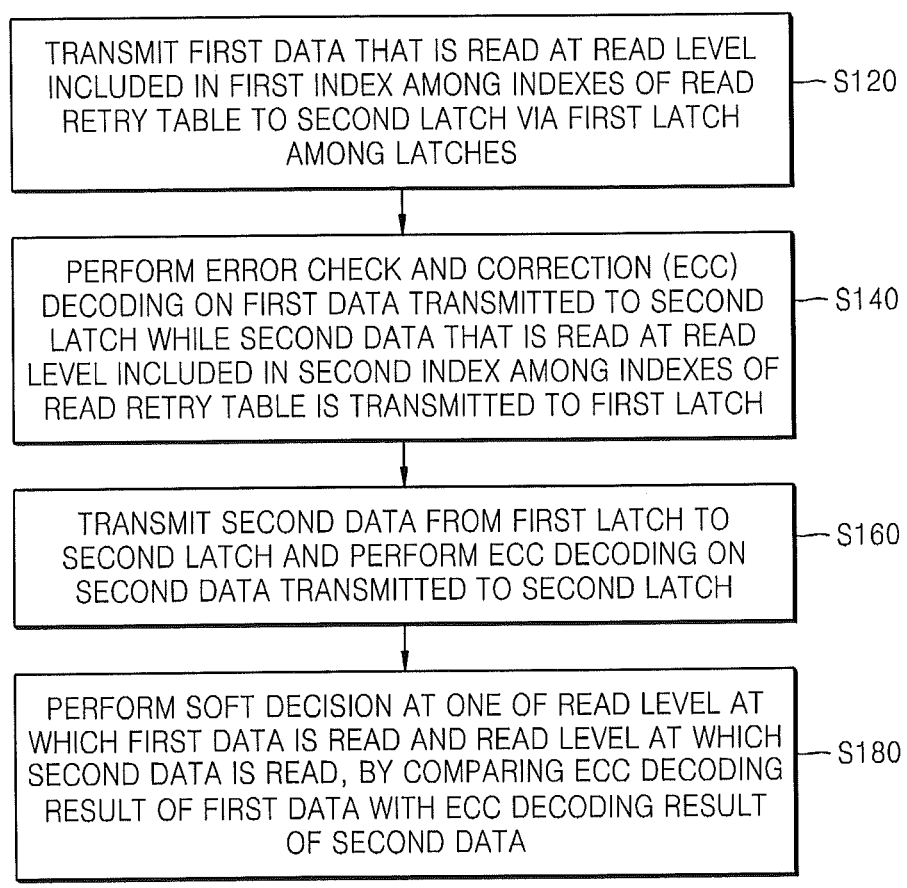
FIG. 1 is a flowchart illustrating a read method in a flash memory system, according to an exemplary embodiment of the inventive concept.

Example embodiments of the inventive concept will be described more fully with reference to the accompanying drawings. The attached drawings for illustrating exemplary embodiments of the inventive concept are referred to in order to gain a sufficient understanding of the inventive concept, the merits thereof, and the objectives accomplished by the implementation of the inventive concept. The inventive concept may, however, be embodied in many different forms and should not be construed as being limited to the embodiments set forth herein; rather, these embodiments are provided so that this disclosure will be thorough and complete, and will fully convey the concept of the invention to those skilled in the art.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. As used in the specification, the terms "and/or" include one among the items described above and one or more combinations thereof.

It will be understood that, although the terms first, second, third etc. may be used herein to describe various elements, components, regions, layers and/or sections, these elements, components, regions, layers and/or sections should not be limited by these terms. These terms refer to a particular order, rank, or superiority and are only used to distinguish one element, component, region, layer or section from another element, component, region, layer or section. Thus, a first element, component, region, layer or section discussed below could be termed a second element, component, region, layer or section without departing from the teachings of the example embodiment. For example, a first element may be referred to as a second element, and similarly, a second element may be referred to as a first element without departing from the scope of protection of the inventive concept.

Hereinafter, exemplary embodiments of the present invention will be described with reference to accompanying drawings schematically illustrating the embodiments. In the drawings, for example, illustrated shapes may be deformed according to fabrication technology and/or tolerances. Therefore, the exemplary embodiments of the present invention are not limited to certain shapes illustrated in the present specification, and may include modifications of shapes caused in fabrication processes.

FIG. 1 is a flowchart illustrating a read method in a flash memory system, according to an exemplary embodiment of the inventive concept. Referring to FIG. 1, the read method according to the current embodiment may include: transmitting first data that is read at a read level included in a first index among indexes of a read retry table to a second latch via a first latch among latches (S120); performing error check and correction (ECC) decoding on the first data transmitted to the second latch while second data that is read at a read level included in a second index among the indexes of the read retry table is transmitted to the first latch (S140); transmitting the second data transmitted to the first latch to the second latch and performing ECC decoding on the second data transmitted to the second latch (S160); and performing soft decision at one of the read level at which the first data is read and the read level at which the second data is read, by comparing an ECC decoding result of the first data with an ECC decoding result of the second data (S180).

Figure 2:
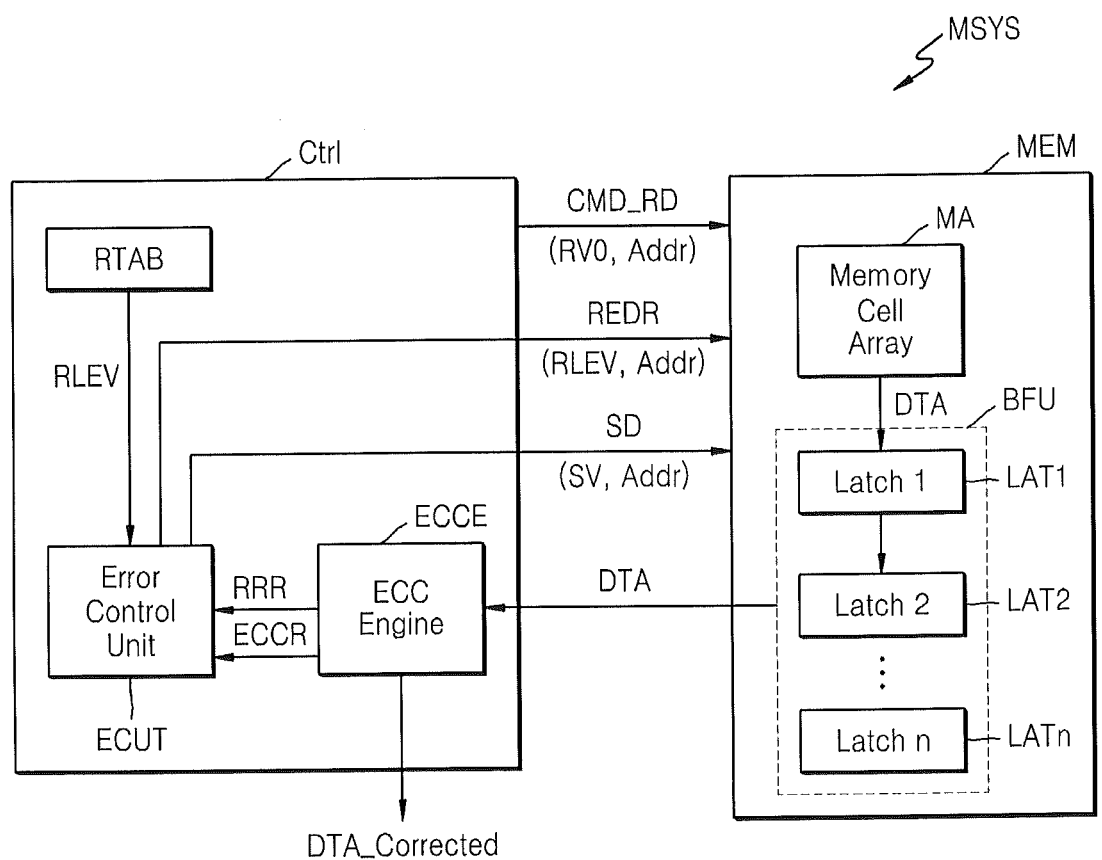
FIG. 2 is a block diagram of a flash memory system according to an exemplary embodiment of the inventive concept.

FIG. 2 is a block diagram of a flash memory system MSYS according to an exemplary embodiment of the inventive concept. Referring to FIGS. 1 and 2, a read method in the flash memory system MSYS illustrated in FIG. 2 may be the read method illustrated in FIG. 1. The flash memory system MSYS of FIG. 2 may include a flash memory MEM that stores data DTA and a memory controller Ctrl that controls a programming or reading of the flash memory MEM. The flash memory MEM may be a NAND flash memory. The flash memory MEM may include a memory cell array MA and a buffer unit BFU. Although the flash memory MEM may further include a control logic, an input/output unit, and a power generator, and the like, a description thereof is omitted. The flash memory MEM may output the data DTA stored in the memory cell array MA in response to a read command CMD_RD. In detail, the flash memory MEM may apply an initial read voltage RV0 to memory cells corresponding to an address Addr of the read command CMd_RD, thereby outputting data DTA stored in the memory cells to the memory controller Ctrl via the buffer unit BFU. The buffer unit BFU according to the current embodiment may include a plurality of latches LAT1 to LATn. In addition, the flash memory MEM may output data DTA to be read at a read level RLEV of a read retry REDR that is described below in the same way as a case where the data DTA is output by applying the initial read voltage RV0 of the read command CMD_RD. However, FIG. 2 illustrates the read retry REDR and the read command CMD_RD separately, and as described below, the read retry REDR may represent a variation from the read command CMD_RD to the read level RLEV for read retrying the initial read voltage RV0. This will be described below in more detail.

Figure 3A:
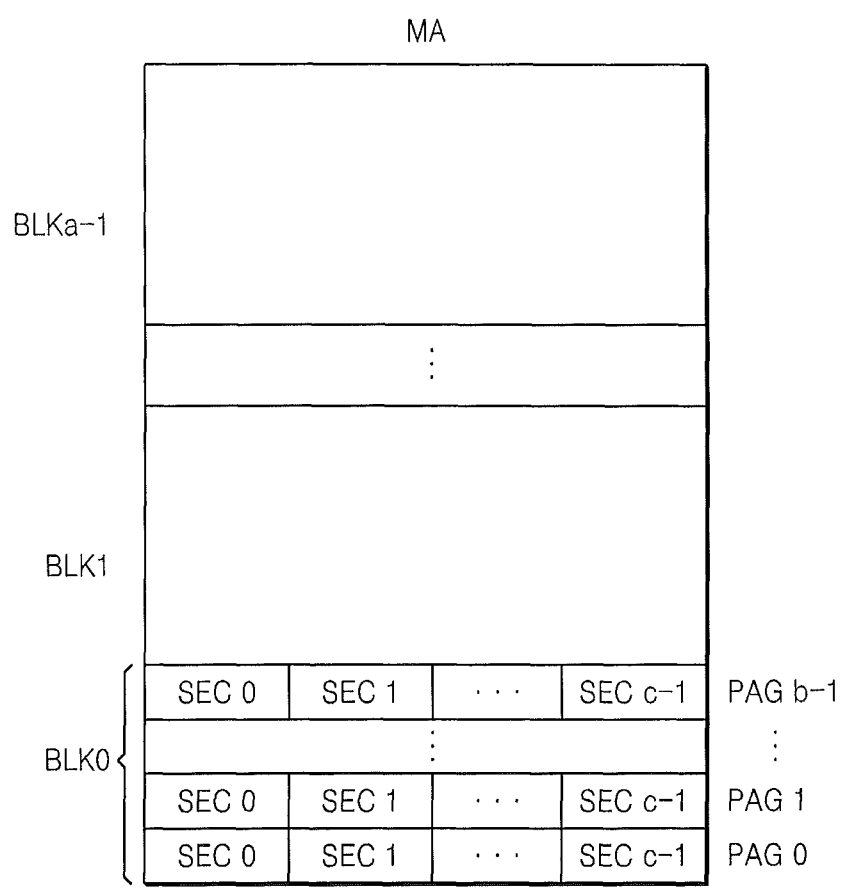
FIGS. 3A and 3B illustrate a memory cell array of a flash memory of the flash memory system illustrated in FIG. 2.

The memory cell array MA of the flash memory MEM illustrated in FIG. 2 may have a structure illustrated in FIG. 3A. FIG. 3A illustrates the memory cell array MA of the flash memory MEM of the flash memory system illustrated in FIG. 2. The memory cell array MA may include a blocks BLK0 to BLKa−1 (where a is an integer that is equal to or greater than 2). Here, each of the blocks BLK0 to BLKa−1 may include b pages PAG0 to PAGb−1 (where b is an integer that is equal to or greater than 2), and each of the pages PAG0 to PAGb−1 may include c sectors SEC0 to SECc−1 (where c is an integer that is equal to or greater than 2). In FIG. 3A, for convenience, the pages PAG0 to PAGb−1 and the sectors SEC0 to SECc−1 are illustrated only for the block BLK0. However, the other blocks BLK1 to BLKa−1 may have the same structure as that of the block BLK0.

Figure 3B:
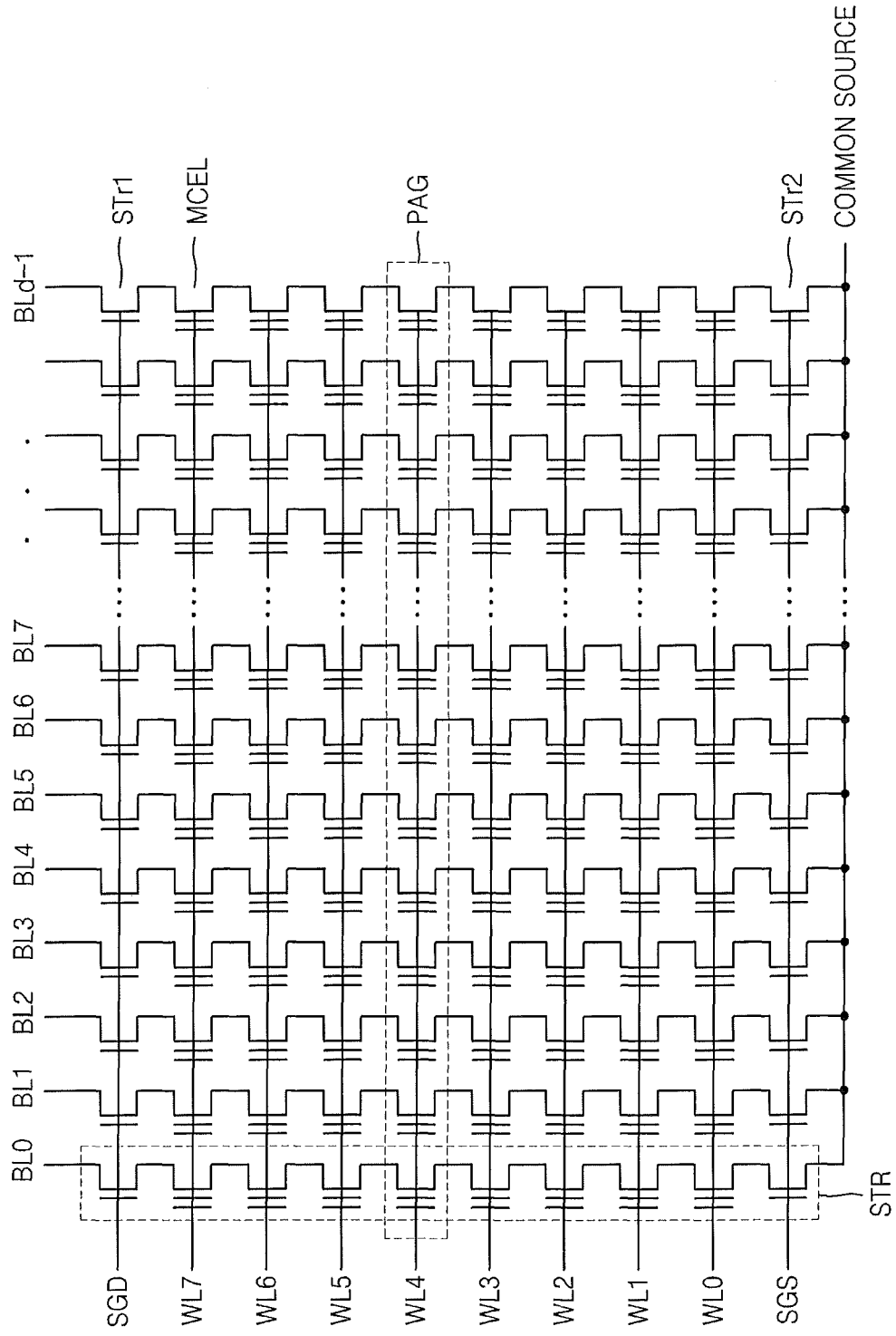

When the memory cell array MA illustrated in FIG. 2 is a memory cell array of a NAND flash memory, the blocks BLK0 to BLKa−1 illustrated in FIG. 3A may have a structure illustrated in FIG. 3B. FIG. 3B illustrates the memory cell array MA of the flash memory MEM of the flash memory system illustrated in FIG. 2. Referring to FIG. 3B, the blocks BLK0 to BLKa−1 each may include d strings STR (where d is an integer that is equal to or greater than 2) in which eight memory cells MCEL are connected in series in directions of bit lines BL0 to BLd−1. Each string STR may include a drain selection transistor STr1 and a source selection transistor STr2 that are connected to both ends of the memory cells MCEL connected in series, respectively.

In the NAND flash memory having the memory cell array structure of FIG. 3B, erase is performed in units of blocks and a program is executed in units of pages PAG corresponding to word lines WL0 to WL7. FIG. 3B illustrates an example in which eight pages PAG corresponding to the word lines WL0 to WL7 are arranged in one block. However, the blocks BLK0 to BLKa−1 of the memory cell array MA illustrated in FIG. 2 may include a different number of memory cells and pages from the number of memory cells MCEL and pages PAG illustrated in FIG. 3B. Also, the flash memory MEM of FIG. 2 may include a plurality of memory cell arrays that have the same structure and perform the same operation as that of the memory cell array MA described above.

Figure 4A:
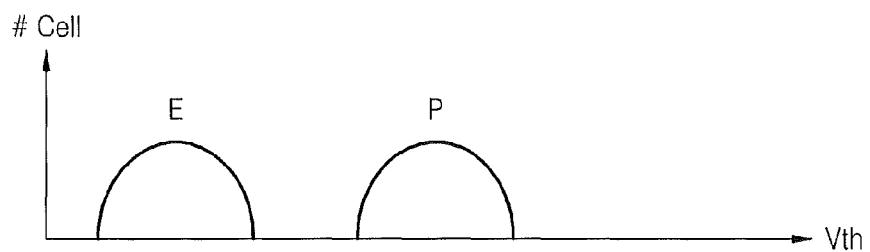
FIGS. 4A through 4C illustrate distribution of memory cells of the flash memory illustrated in FIG. 2.
Figure 4B:
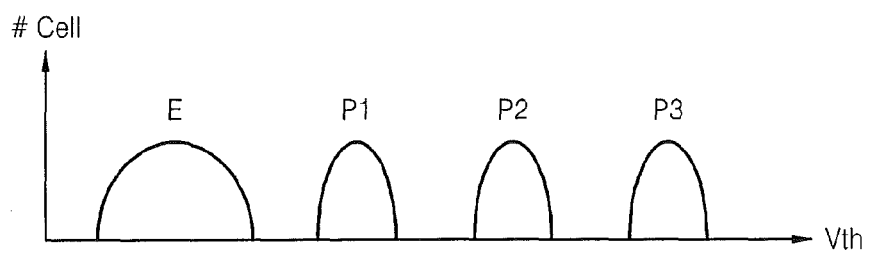
Figure 4C:
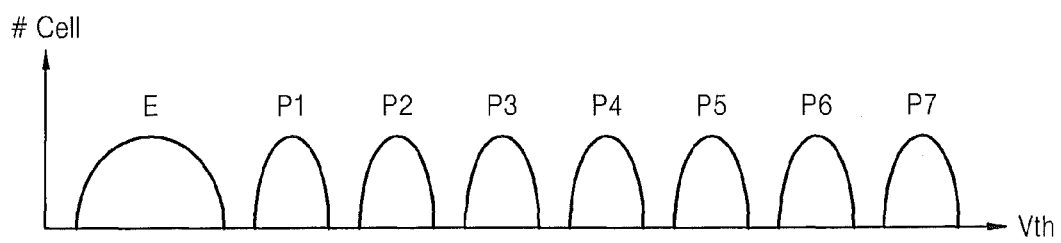

Each memory cell MCEL of the flash memory MEM having the memory cell array structure of FIG. 3B may have a threshold voltage Vth of one of the distributions illustrated in FIGS. 4A through 4C according to the number of bits of program data programmed in the flash memory MEM. FIG. 4A illustrates the distribution of cells in a single-level cell (SLC) flash memory in which each memory cell MCEL is programmed with 1 bit, FIG. 4B illustrates the distribution of cells in a 2-bit multi-level cell (MLC) flash memory in which each memory cell MCEL is programmed with 2 bits, and FIG. 4C illustrates the distribution of cells in a 3-bit MLC flash memory in which each memory cell MCEL is programmed with 3 bits.

In the SLC flash memory, each memory cell MCEL of the memory cell array MA of FIG. 3B has a threshold voltage that is either in an erase state E or a programmed state P, as illustrated in FIG. 4A, based on a value of programmed data. Alternatively, in the 2-bit MLC flash memory, each memory cell MCEL of the memory cell array MA of FIG. 3B has a threshold voltage that is in one of an erase state E and first through third programmed states P1 to P3, as illustrated in FIG. 4B. Alternatively, in the 3-bit MLC flash memory, each memory cell MCEL of the memory cell array MA of FIG. 3B has a threshold voltage that is in one of an erase state E and first through seventh programmed states P1 to P7, as illustrated in FIG. 4C. However, aspects of the inventive concept are not limited thereto, and each memory cell MCEL of the memory cell array MA of FIG. 3B may be programmed with 4 bits or more, although not shown. In addition, the flash memory MEM illustrated in FIG. 2 may include memory cells MCEL that are programmed with a different number of bits.

Figure 5A:
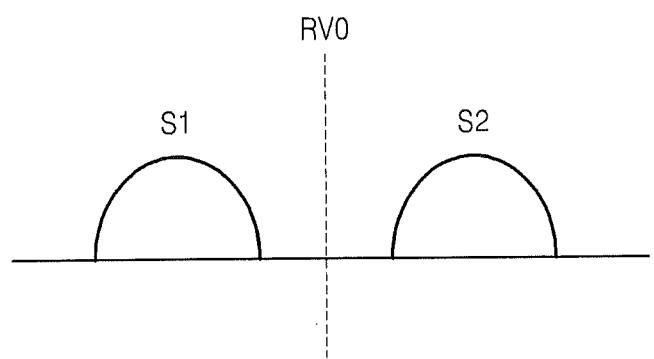
FIGS. 5A and 5B illustrate examples of read errors.
Figure 5B:
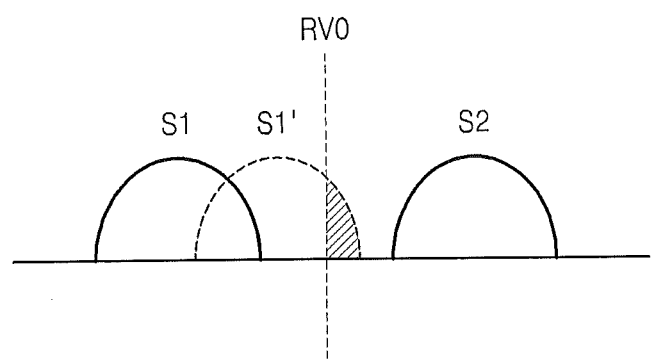

Referring back to FIG. 2, the memory controller Ctrl may include an ECC engine ECCE and an error control unit ECUT. The ECC engine ECCE checks whether an error (read error) occurs in data DTA read by the flash memory MEM and corrects the error. The read error may occur as the distribution of cells is moved, as illustrated in FIG. 5B, due to a variation in read environment of the flash memory MEM, wherein two cell distributions S1 and S2 are identified by an initial read voltage RV0 that is set at a voltage level between the two cell distributions S1 and S2, as illustrated in FIG. 5A. The variation in the read environment may occur due to retention characteristics or a read disturb phenomenon of a flash memory. FIG. 5B illustrates an example in which the first cell distribution S1 is moved in a direction of the second cell distribution S2. In the example of FIG. 5B, when data DTA is read with the initial read voltage RV0, a read error in which data DTA that is different from programmed data is read with the initial read voltage RV0, may occur in a hatched portion.

As described above, the ECC engine ECCE may check and correct the read error included in the data DTA that is read with the initial read voltage RV0. For example, the ECC engine may correct the read error by comparing a parity that is generated and stored when the data DTA is programmed with a parity that is generated when the data DTA is read, by detecting an error bit of the data DTA and by performing an XOR operation on the detected error bit. However, the read error may not be corrected by such error correction.

The error control unit ECUT may control an error that is not corrected by the above-described error correction operation of the ECC engine ECCE by performing read retry in response to a read retry request (RRR) that is transmitted from the ECC engine ECCE. The error control unit ECUT may control the error so that read is repeatedly performed on the data DTA that is programmed in the address Addr of the read command CMD_RD with a read level that is selected from the read retry table RTAB illustrated in FIG. 6 and is different from a read level of the initial read voltage RV0. In FIG. 2, the read retry REDR is differentiated from the read command CMD_RD only so as to represent that concepts of the read command CMD_RD and the read retry REDR are different from each other. That is, the read retry REDR may represent a variation from the initial read voltage RV0 to the read level RLEV.

Figures 6, 7:
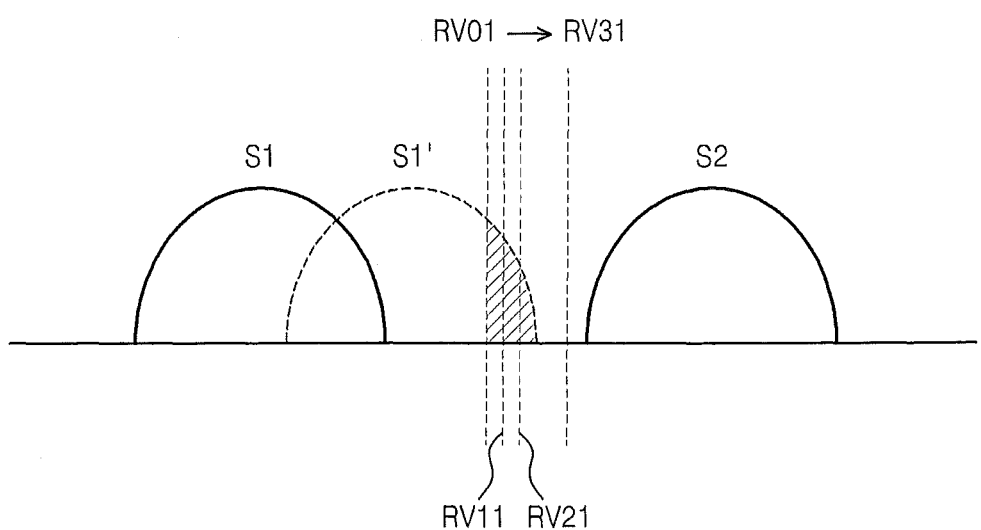
FIG. 6 illustrates an example of a read retry table.
FIG. 7 illustrates an example of a read retry operation.

Referring to FIG. 6, the read retry table RTAB may include a read level for each index. In addition, a plurality of read levels may be included in each index of the read retry table RTAB. FIG. 6 illustrates an example in which three read levels RLEV1, RLEV2, and RLEV3 are included in each index. For example, index 0 of the read retry table RTAB of FIG. 6 may include read levels RLEV1, RLEV2, and RLEV3 having values of RV11, RV12, and RV13, respectively, and index 1 of the read retry table RTAB of FIG. 6 may include read levels RLEV1, RLEV2, and RLEV3 having values of RV21, RV22, and RV23, respectively. This is because the MLC flash memory requires a plurality of read levels for reading MLC. For example, three values of read levels have to be different from each other so as to differentiate four states (cell distribution), as illustrated in FIG. 4B.

The error control unit ECUT illustrated in FIG. 2 may control a read error so that a read retry operation is performed in such a way that read levels are sequentially changed from a read level of one index to a read level of a next index until the read error is corrected. For example, when the read retry operation has been performed at read levels RV11, RV12, and RV13 of index 0 of the read retry table RTAB but the read error has not been corrected, a read retry operation may be performed again with read levels RV21, RV22, and RV23 of index 1 of the read retry table RTAB. When the read error has not been corrected even after the read retry operation is performed again, read retry may be performed again with read levels RV31, RV32, and RV33 of index 2 of the read retry table RTAB.

Accordingly, as illustrated by FIGS. 1, 3A and 6, methods of operating nonvolatile memory devices according to embodiments of the invention include reading a first plurality of multi-bit nonvolatile memory cells in the nonvolatile memory device using a first plurality of read voltages to thereby generate first read data, and then rereading the first plurality of multi-bit nonvolatile memory cells using a second plurality of read voltages that differ, at least in part, from the first plurality of read voltages, to thereby generate second read data. (Blocks S120, S140). An operation is then undertaken to perform first and second ECC decoding operations on the first and second read data, respectively, to thereby identify whether the first read data or the second read data more accurately reflects data stored in the first plurality of multi-bit nonvolatile memory cells during the reading and rereading. (Blocks S140, S160). According to some of these embodiments of the invention, the step of performing first ECC decoding operations on the first read data is performed concurrently with the rereading. (See, e.g., Block S14). According to additional embodiments of the invention, the values of the first plurality of read voltages (e.g., RV11, RV12, . . . , RV13) and the values of the second plurality of read voltages (e.g., RV21, RV22, . . . , RV23) are stored as first and second indexes, respectively, within a read retry table, which may be stored in the nonvolatile memory device. (See, e.g., RTAB in FIG. 6).

Moreover, as illustrated by FIGS. 1 and 3A, the performing first ECC decoding operations may include comparing a number of sectors (SEC0, SEC1, . . . , SEC c−1) having errors within the first read data against a number of sectors having errors within the second read data. This comparing operation may include determining average iterations associated with the performing first and second ECC decoding operations in the event the number of sectors having errors within the first read data is equivalent to the number of sectors having errors within the second read data. Operations may also be performed to update at least one of the first and second indexes in the read retry table in response to an update in wear information stored within a wear-out table. According to still further embodiments of the invention, an additional operation may be performed to reread the first plurality of multi-bit nonvolatile memory cells using a third plurality of read voltages that differ, at least in part, from the first plurality of read voltages and from the second plurality of read voltages, to thereby generate third read data, in response to detecting an excessive number of errors in the first and second read data during the performing first and second ECC decoding operations on the first and second read data.

Referring to FIG. 7, if a first initial read voltage for identifying first cell distribution S1 and second cell distribution S2 among initial read voltages RV0 is RV01, an error in identification (read) between the first cell distribution S1 and the second cell distribution S2 still occurs when read retry is performed at the first read level RV11 of index 0 of the read retry table RTAB and the first read level RV21 of index 1 of the read retry table RTAB, as in the above-described example. Next, the first cell distribution S1 and the second cell distribution S2 may be precisely read at the first read level RV31 of index 2 of the read retry table RTAB.

Figure 8:
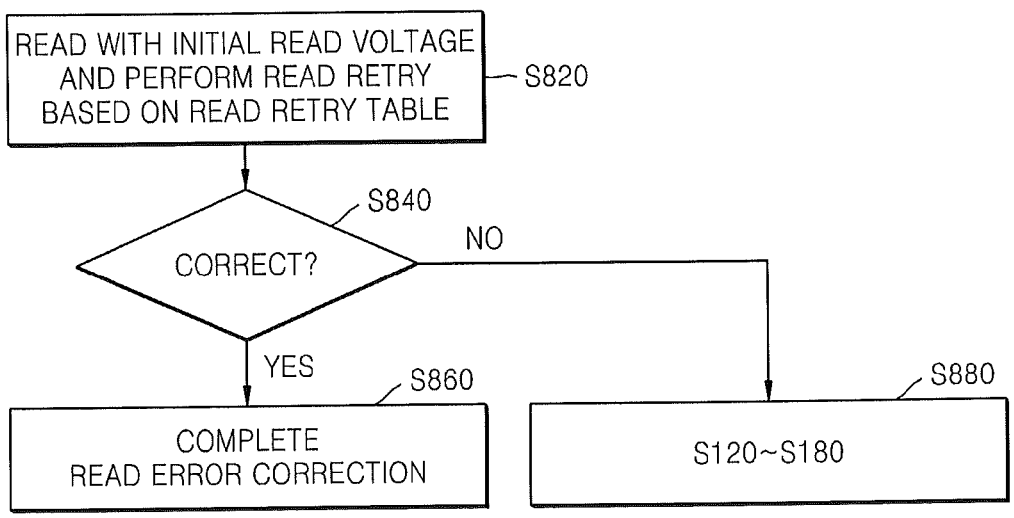
FIG. 8 is a flowchart illustrating when operations of the read method illustrated in FIG. 1 are performed.

However, when there is an error that is not corrected at read levels RVn1, RVn2, and RVn3 of index n of the read retry table RTAB, operations S120 to S180 of FIG. 1 may be performed, as illustrated in FIG. 8. In detail, in the read method illustrated in FIG. 1, when a read command CMD_RD is executed with the initial read voltage RV0 of FIG. 2 and an error that occurs when the read command CMD_RD is executed is not corrected, read retry is performed (S820), and if as a result of performing read retry, the read error is corrected (in the case of YES of S840), correction of the read error is completed (S860). On the other hand, if the error is not corrected even by performing read retry at the read levels RVn1, RVn2, and RVn3 of the last index n of the read retry table RTAB (in the case of NO of S840), soft decision using the read method of FIG. 1 is performed (S880). This will be described in more detail.

Referring back to FIGS. 1 and 2, the data DTA that is programmed in the memory cell array MA by executing the read command CMD_RD or by performing read retry REDR is read via the buffer unit BFU, as described above. The buffer unit BFU may include the latches LAT1 to LATn. While data DTA is received from one of the plurality of latches LAT1 to LATn, the buffer unit BFU may output data DTA from another latch than the latch from which the data DTA is received, as illustrated in FIG. 9. Such a data read operation is referred to as cache read retry.

Figure 9A:
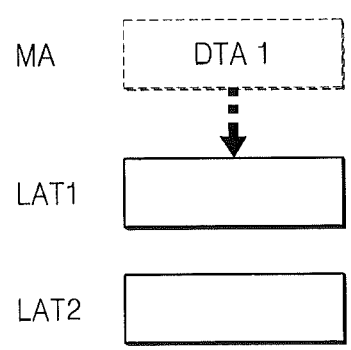
FIGS. 9A through 9C illustrate flow of data in a buffer illustrated in FIG. 2.
Figure 9B:
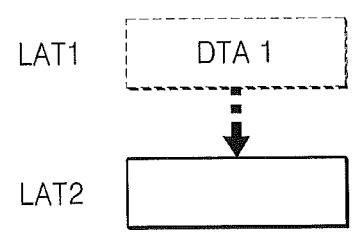
Figure 9C:
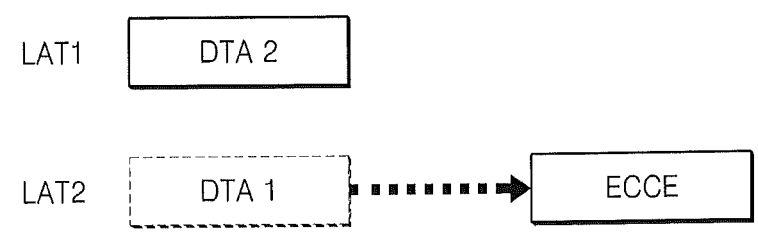

Referring to FIG. 9A, first data DTA1 is transmitted from the memory cell array MA to the first latch LAT1. Next, the first data DTA1 transmitted to the first latch LAT1 is re-transmitted to the second latch LAT2, as illustrated in FIG. 9B. Next, while the second data DTA2 is transmitted from the memory cell array MA to the first latch LAT1, the first data DTA1 transmitted to the second latch LAT2 may be output to the ECC engine ECCE, as illustrated in FIG. 9C. Although FIG. 9C illustrates that the first data DTA1 and the second data DTA2 are output via the first latch LAT1 and the second latch LAT2, respectively, aspects of the inventive concept are not limited thereto.

Figure 10:
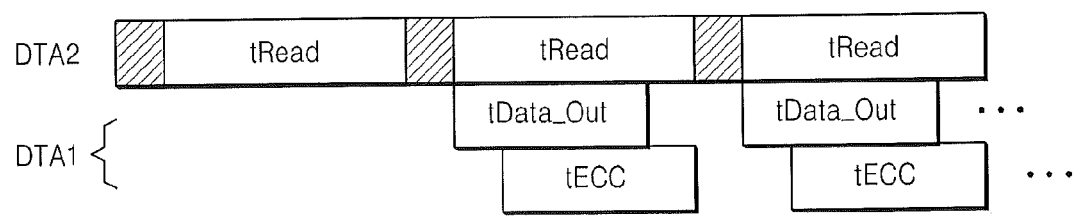
FIG. 10 illustrates an operation of performing error check and correction (ECC) decoding in the read method illustrated in FIG. 1.

Thus, in the read method illustrated in FIG. 1, while the second data DTA2 transmitted to one of the latches LAT1 to LATn is read from the memory cell array MA, ECC decoding may be performed by outputting the first data DTA1 transmitted to another latch than the latch to which the second data DTA2 is transmitted, as illustrated in FIG. 10. Thus, a data output time tData_Out or an ECC decoding time tECC is shadowed during time tREAD for a data read operation. Although decoding is performed on all ECC sectors, a performance of the flash memory system MSYS is not deteriorated.

Thus, in the read method illustrated in FIG. 1, when ECC decoding is performed in all fields (ECC sectors (ECC units)) of the data DTA, the performance of the flash memory system MSYS is deteriorated, and the case where, when only an ECC sector that is not corrected is decoded, the number of actually-corrected ECC sectors and the number of ECC sectors detected as being corrected are different from each other may be prevented so that the number of precisely-corrected ECC sectors may be detected.

Referring to FIGS. 2 and 11, the ECC engine ECCE transmits an ECC result ECCR of data that is read at a read level included in each index of the read retry table RTAB, to the error control unit ECUT. The ECC result ECCR includes information regarding ECC sectors that are corrected by a read level of each index of the read retry table RTAB. For example, in an example of FIG. 11 where the read retry table RTAB includes four indexes, the ECC result ECCR may represent that two ECC sectors with respect to index 1 are corrected and four ECC sectors with respect to index 2 are corrected. In addition, the ECC result ECCR may represent that five ECC sectors with respect to index 3 are corrected and two ECC sectors with respect to index 4 are corrected. The error control unit ECUT selects a read index of one index from among the indexes of the read retry table RTAB. In this regard, the error control unit ECUT may select the largest number of corrected ECC sectors. In the example of FIG. 11, the error control unit ECUT may select index 3 of which five ECC sectors are corrected, from among the indexes of the read retry table RTAB.

Figure 12:
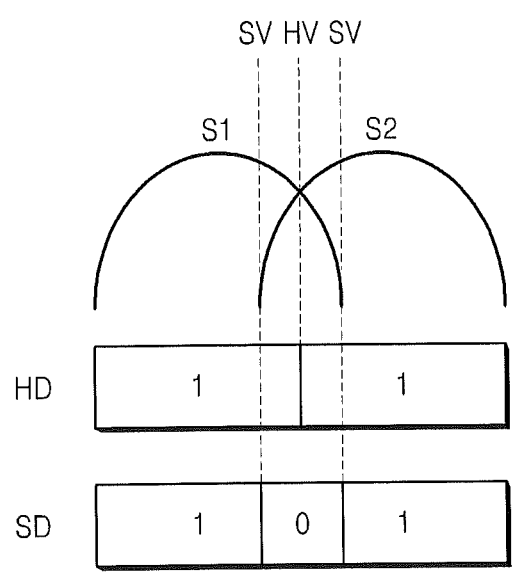

The error control unit ECUT may perform soft decision based on a read level of the selected index. A low density parity check code (LDPC) type of the ECC engine ECCE may correct an error based on hard data DTA obtained by performing hard decision and soft data DTA obtained by performing soft decision, as illustrated in FIG. 12. The error control unit ECUT may set the read level of index 3 of FIG. 11 to a read level HV for performing hard decision of FIG. 12. In this regard, the error control unit ECUT may set a read level SV for performing soft decision of FIG. 12 based on the read level HV for performing hard decision of FIG. 12. Although, in FIG. 12, soft decision SD is differentiated from the read command CMD_RD, this is just to clarify concepts of soft decision SD and the read command CMD_RD. Soft decision SD may represent a variation from the initial read voltage RV0 to the read level RLEV for performing soft decision.

By performing the above-described error correction operations, the ECC engine ECCE of FIG. 2 may output corrected data DTA_Corrected to an outside of the flash memory system MSYS. In this way, in the read method illustrated in FIG. 1, the read level of the read retry having the best correction capability may be precisely corrected, and soft decision may be performed based on the read level of the read retry having the best correction capability so that speed and reliability of error correction may be improved.

The case where there is one read level having the largest number of corrected ECC sectors has been described above. However, when there are two or more read levels having the largest number of corrected ECC sectors, as illustrated in FIG. 13, the error control unit ECUT may perform soft decision based on a read level at which the smallest average iteration number is recorded. FIG. 13 illustrates the case where there are two read levels having the largest number of ECC sectors corrected with respect to index 2 and index 3 of the read retry table.

As described above, read retry is sequentially performed from a first index of one read retry table. However, aspects of the inventive concept are not limited thereto. In the read method of FIG. 1 and the flash memory system MSYS of FIG. 2, read retry may be performed based on wear-out included in status information Inf_ST detected from the flash memory MEM in response to a first command CMD1 transmitted from the memory controller Ctrl to the flash memory MEM and information regarding a read level of which an error is corrected at the previous request of read retry.

Figures 14, 15:
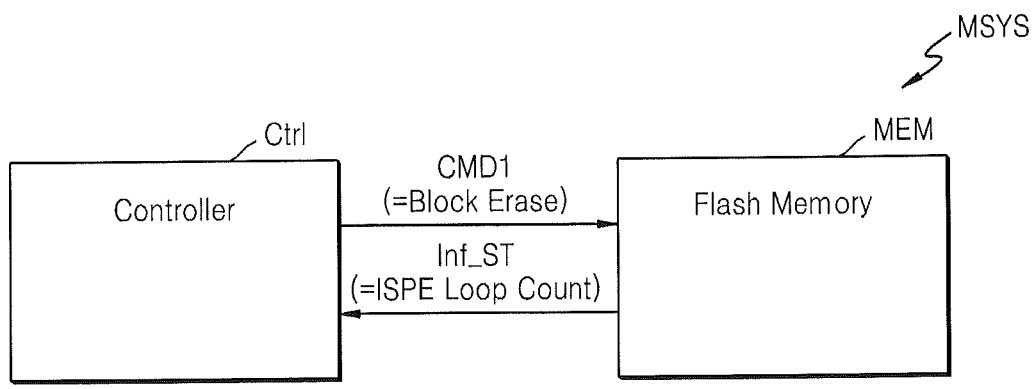

In FIG. 14, when the first command CMD1 may be an erase command and is executed using an incremental step pulse erase (ISPE) method, wear-out included in the status information Inf_ST regarding the erase command may correspond to an ISPE loop count value. The ISPE loop count value represents the number of erase voltage pulses required for erasing a selected block in response to the erase command.

A wear-out table WTAB illustrated in FIG. 15 may use each block of the flash memory MEM as an index and may include wear-out WO included in the status information Inf_ST with respect to each block and information LInd regarding a read level of which an error is corrected at the previous request of read retry. For example, the index of the wear-out table WTAB may be addresses 0 to a−1 with respect to the blocks BLK0 to BLKa−1 of FIG. 3.

In the read method of FIG. 1 and the flash memory system MSYS of FIG. 2, the read retry table RTAB may be selected based on wear-out shown in the wear-out table WTAB. In the read method of FIG. 1 and the flash memory system MSYS of FIG. 2, the read retry table RTAB may be separately provided for each endurance of the flash memory MEM. Endurance of the flash memory MEM may be marked by a program/erase (P/E) cycle. For example, a first read retry table RTABA illustrated in FIG. 16 may be a read retry table showing the case where the P/E cycle is less than 1K, and a second read retry table RTABB of FIG. 16 may be a read retry table showing the case where the P/E cycle is greater than 1K and is less than 2K, and a third read retry table RTABC of FIG. 16 may be a read retry table showing the case where the P/E cycle is greater than 2K and is less than 3K. However, aspects of the inventive concept are not limited thereto, and the first read retry table RTABA, the second read retry table RTABB, and the third read retry table RTABC illustrated in FIG. 16 may be set for different numbers of P/E cycles.

When read retry on an arbitrary block is required, the error control unit ECUT may select one from among a plurality of read retry tables based on wear-out of a selected index of the wear-out table WTAB. For example, if wear-out of a block BLK1 corresponding to index 1 shown in FIG. 15 is 2, the error control unit ECUT may perform a read retry operation on the block BLK 1 by referring to the first read retry table RTABA of which P/E cycle is less than 1K, among the first read retry table RTABA through the third read retry table RTABC illustrated in FIG. 16.

In this way, in the flash memory system MSYS of FIG. 2 and the read method of FIG. 1, read retry is performed by referring to a read retry table that is separately provided for each endurance when a read error is increased due to high-integration of a flash memory and a read retry start time is faster so that the number of read retries may be minimized.

In addition, as described above, the wear-out table WTAB illustrated in FIG. 15 may include information LInd regarding a read level of which an error is corrected at the previous request of read retry. Thus, in the flash memory system MSYS of FIG. 2 and the read method of FIG. 1, when read retry on a block is repeatedly requested, read retry is performed on the block at a read level of which an error is recently corrected, so that the number of read retries may be minimized. For example, if information LInd regarding a read level of which an error is corrected at the previous request of read retry on the block BLK1 of index 1 of FIG. 15 is 1, the error control unit ECUT may set a read level of index 1 of a read retry table corresponding to wear-out information among the first read retry table RTABA to the third read retry table RTABC to a read level for starting read retry according to the current request. Thus, in the flash memory system MSYS of FIG. 2 and the read method of FIG. 1, consumption of system resources may be reduced and time required for read retry may be reduced.

Figure 17:
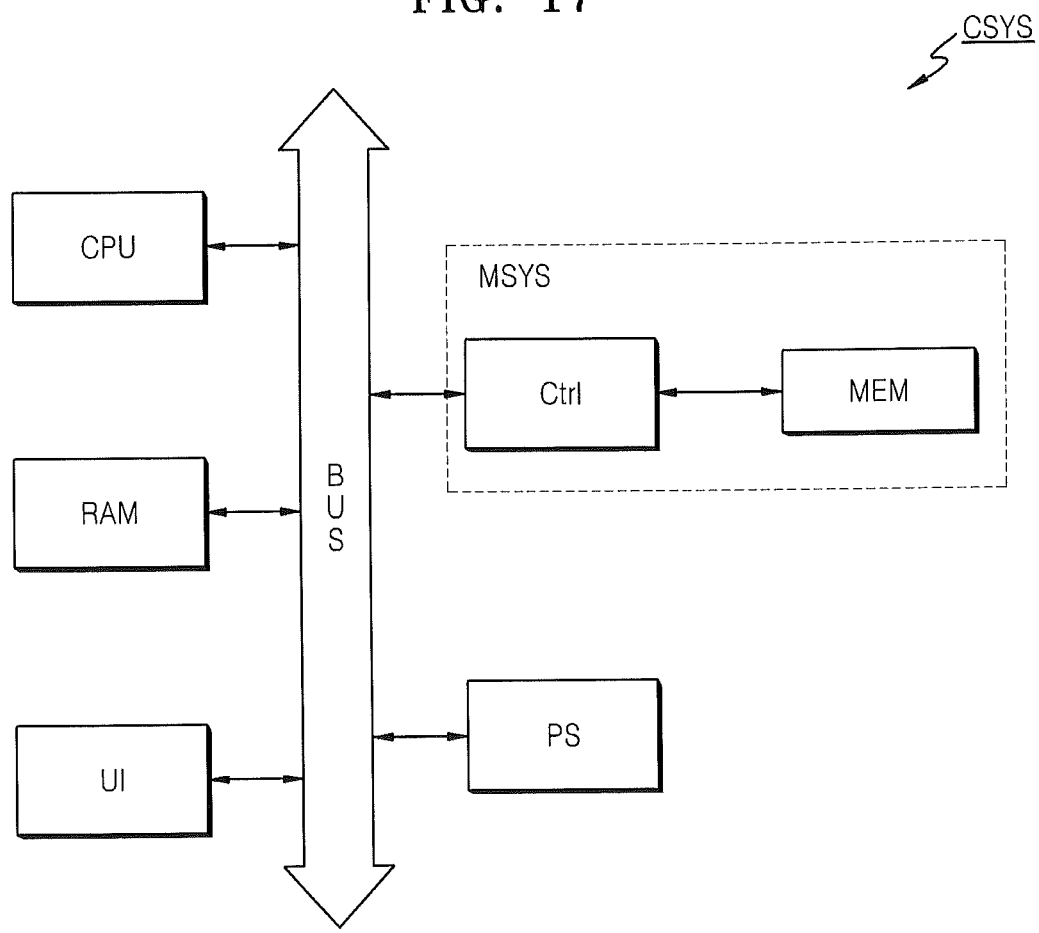
FIG. 17 is a block diagram of a computing system according to an exemplary embodiment of the inventive concept.

FIG. 17 is a block diagram of a computing system CSYS according to an exemplary embodiment of the inventive concept. Referring to FIG. 17, the computing system CSYS according to the current embodiment may include a central processing unit (CPU) that is electrically connected to a bus BUS, a user interface UI, and a flash memory system MSYS. The flash memory system MSYS may include a memory controller Ctrl and a flash memory MEM. N-bit data (where N is 1 or an integer greater than 1) that is processed or to be processed by the CPU may be stored in the flash memory MEM by an operation of the memory controller Ctrl. The flash memory system MSYS of FIG. 17 may be the same as the flash memory system MSYS of FIG. 2. Thus, in the computing system CSYS, read reliability of the flash memory system MSYS may be improved.

The computing system CSYS illustrated in FIG. 17 may further include a power supply unit PS. In addition, when the flash memory MEM is a flash memory device that executes a program using the programming method illustrated in FIG. 2, the computing system CSYS of FIG. 17 may further include a volatile memory device, for example, a read access memory (RAM).

When the computing system CSYS of FIG. 17 is a mobile device, a battery for supplying an operating voltage to the computing system CSYS, and a modem, such as a baseband chipset, may be additionally provided to the mobile device. In addition, it is obvious to one of ordinary skill in the art that an application chipset, a camera image processor (CIS), a mobile DRAM, and the like may be further provided to the computing system CSYS of FIG. 17. Thus, a further detailed description thereof is omitted.

Figure 18:
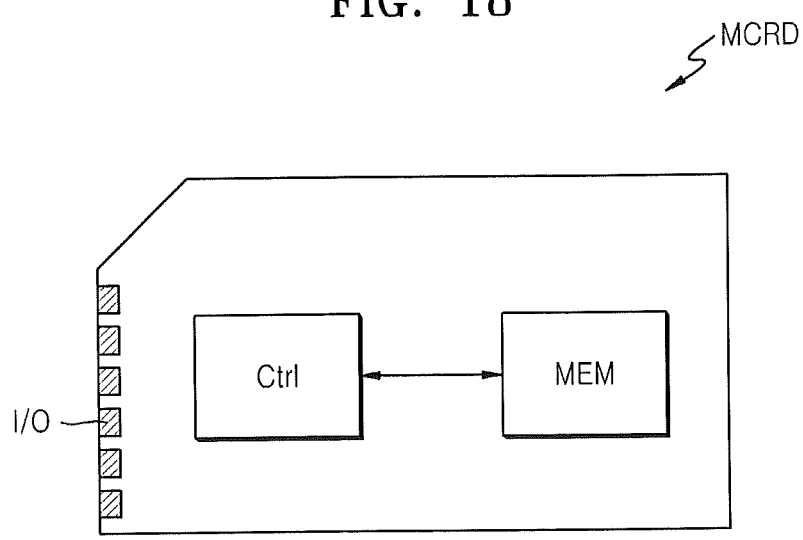
FIG. 18 is a block diagram of a memory card according to an exemplary embodiment of the inventive concept.

FIG. 18 is a block diagram of a memory card MCRD according to an exemplary embodiment of the inventive concept. Referring to FIG. 18, the memory card MCRD according to the current embodiment may include a memory controller Ctrl and a flash memory MEM. The memory controller Ctrl may control the flash memory MEM to write data therein or to read data therefrom in response to a request of an external host (not shown) that is received from an input/output unit I/O. In addition, the memory controller Ctrl may control an erase operation of the flash memory MEM. The memory controller Ctrl of the memory card MCRD illustrated in FIG. 18 may include interface units (not shown) that interface with a host and a memory device, respectively, and a RAM so as to perform the control operations described above. The memory card MCRD illustrated in FIG. 18 may be implemented as the flash memory system MSYS illustrated in FIG. 2. The memory device MCRD of FIG. 18 may be implemented as a compact flash card (CFC), a microdrive, a smart media card (SMC), a multimedia card (MMC), a security digital card (SDC), a memory stick, a universal serial bus (USB) flash memory, or the like. Thus, in the memory card MCRD illustrated in FIG. 18, read reliability of the flash memory system MSYS of FIG. 2 may be improved and overhead in the flash memory system MSYS of FIG. 2 may be reduced.

Figure 19:
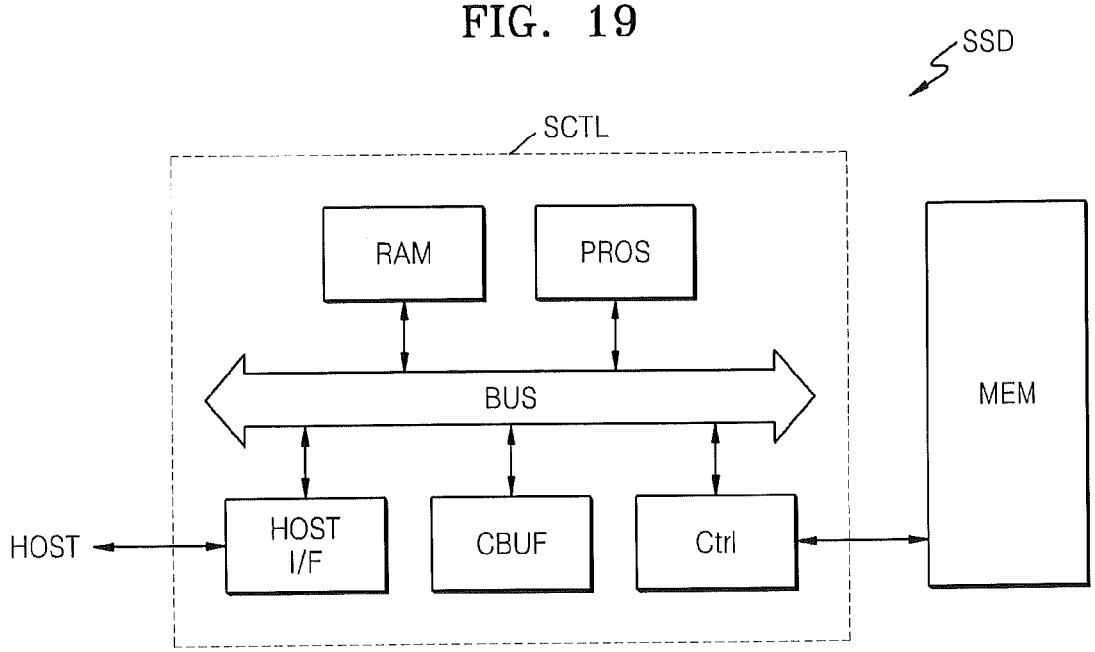
FIG. 19 illustrates a solid state drive (SSD) according to an exemplary embodiment of the inventive concept.

FIG. 19 illustrates a solid state drive (SSD) according to an exemplary embodiment of the inventive concept. Referring to FIG. 19, the solid state drive (SSD) according to the current embodiment may include an SSD controller SCTL and a flash memory MEM. The SSD controller SCTL may include a processor PROS that is connected to a bus BUS, a RAM, a host interface HOST I/F, a cache buffer CBUF, and a memory controller Ctrl. The processor PROS may control the memory controller Ctrl to transmit data to the flash memory MEM or to receive data from the flash memory MEM in response to a request (command, address, and data) of a host (not shown). The processor PROS and the memory controller Ctrl of the SSD controller SCTL may be implemented as an ARM processor. Data required for an operation of the processor PROS may be loaded into the RAM. For example, the read retry table RTAB of FIG. 2 may be loaded into the RAM.

The host interface HOST I/F may receive the request of the host and may transmit the request of the host to the processor PROS or may transmit data that is transmitted from the flash memory MEM to the host. The host interface HOST I/F may perform interface with the host using various interface protocols, such as universal serial bus (USB), man machine communication (MMC), peripheral component interconnect-express (PCI-E), serial advanced technology attachment (SATA), parallel advanced technology attachment (PATA), small computer system interface (SCSI), enhanced small device interface (ESDI), intelligent drive electronics (IDE), and the like. The data that is to be transmitted to the flash memory MEM or is transmitted from the flash memory MEM may be temporarily stored in the cache buffer CBUF. The cache buffer CBUF may be an SRAM, or the like.

The SSD illustrated in FIG. 19 may be implemented as the flash memory system MSYS of FIG. 2. Thus, in the SSD of FIG. 19, read reliability of the flash memory system MSYS of FIG. 2 may be improved and overhead in the flash memory system MSYS of FIG. 2 may be reduced.

Figure 20:
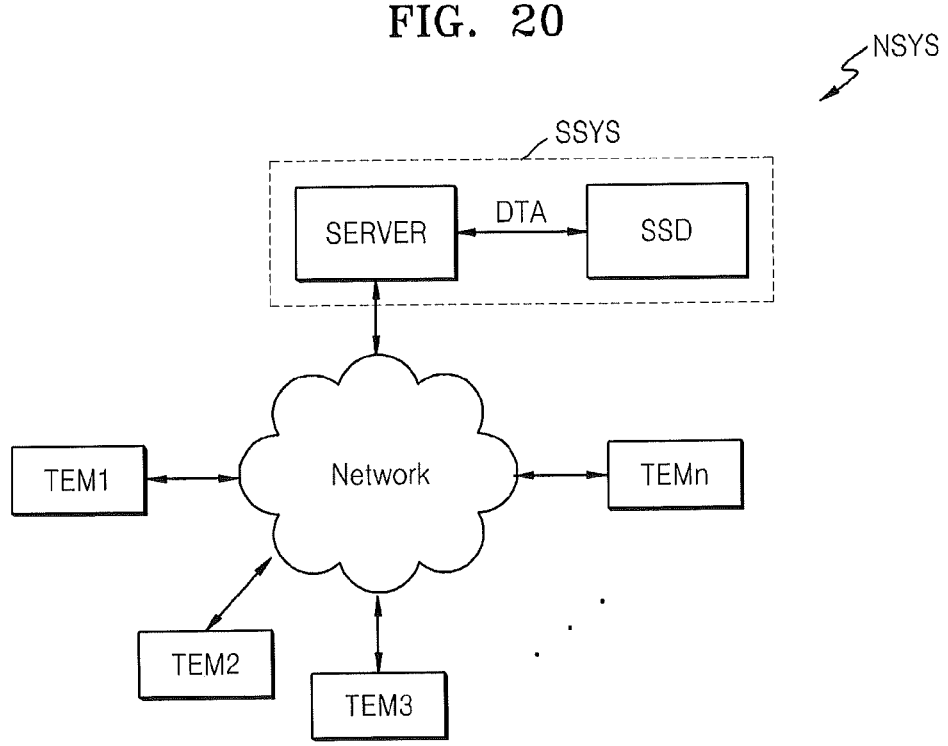
FIG. 20 illustrates a network system including a server system including an SSD.

FIG. 20 illustrates and a network system NSYS including a server system that includes an SSD. Referring to FIG. 20, the network system NSYS according to the current embodiment may include the server system SSYS and a plurality of terminals TEM1 to TEMn, which are connected to each other via a network. The server system SSYS illustrated in FIG. 20 may include a server SERVER that processes a request received from the plurality of terminals TEM1 to TEMn connected to the network, and the SSD for storing data in response to the request received from the terminals TEM1 to TEMn. In this regard, the SSD of FIG. 20 may be the SSD of FIG. 19. That is, the SSD of FIG. 20 may include an SSD controller SCTL and a flash memory MEM, and the flash memory MEM may be a flash memory device that performs a data read operation by using the read method of FIG. 1.

While the inventive concept has been particularly shown and described with reference to exemplary embodiments thereof, it will be understood that various changes in form and details may be made therein without departing from the spirit and scope of the following claims.

What is claimed is:

1. A method of operating a nonvolatile memory device, comprising:
   reading a first plurality of multi-bit nonvolatile memory cells in the nonvolatile memory device using a first plurality of read voltages to thereby generate first read data;
   rereading the first plurality of multi-bit nonvolatile memory cells using a second plurality of read voltages that differ, at least in part, from the first plurality of read voltages, to thereby generate second read data; and
   performing first and second ECC decoding operations on the first and second read data, respectively, to identify whether the first read data or the second read data more accurately reflects data stored in the first plurality of multi-bit nonvolatile memory cells during said reading and rereading, said performing first ECC decoding operations on the first read data being performed concurrently with said rereading; and
   performing soft decision at one of the read level at which the first data is read and the read level at which the second data is read, by comparing an ECC decoding result of the first data with an ECC decoding result of the second data.

2. The method of claim 1, wherein the values of the first plurality of read voltages and the values of the second plurality of read voltages are stored as first and second indexes, respectively, within a read retry table in the nonvolatile memory device.

3. The method of claim 2, further comprising updating at least one of the first and second indexes in the read retry table in response to an update in wear information stored within a wear-out table.

4. The method of claim 1, wherein said performing first ECC decoding operations comprises comparing a number of sectors having errors within the first read data against a number of sectors having errors within the second read data.

5. The method of claim 4, wherein said comparing comprises determining average iterations associated with said performing first and second ECC decoding operations in the event the number of sectors having errors within the first read data is equivalent to the number of sectors having errors within the second read data.

6. The method of claim 1, further comprising rereading the first plurality of multi-bit nonvolatile memory cells using a third plurality of read voltages that differ, at least in part, from the first plurality of read voltages and from the second plurality of read voltages, to thereby generate third read data, in response to detecting an excessive number of errors in the first and second read data during said performing first and second ECC decoding operations on the first and second read data.

7. A read method in a memory system comprising a NAND flash memory including a buffer unit having a plurality of latches and a memory controller for controlling the NAND flash memory to read data from the NAND flash memory, the method comprising:
   transmitting first data that is read at a read level included in a first index among indexes of a read retry table to a second latch via a first latch among the plurality of latches;
   performing error check and correction (ECC) decoding on the first data transmitted to the second latch while second data that is read at a read level included in a second index among the indexes of the read retry table is transmitted to the first latch;
   transmitting the second data from the first latch to the second latch and performing ECC decoding on the second data transmitted to the second latch; and
   performing soft decision at one of the read level at which the first data is read and the read level at which the second data is read, by comparing an ECC decoding result of the first data with an ECC decoding result of the second data.

8. The method of claim 7, wherein each of the ECC decoding result of the first data and the ECC decoding result of the second data includes the number of ECC sectors that are corrected from the first data by performing ECC decoding on the first data and the number of ECC sectors that are corrected from the second data by performing ECC decoding on the second data.

9. The method of claim 8, wherein the performing of the soft decision at one of the read level at which the first data is read and the read level at which the second data is read comprises selecting the read level of the soft decision based on the number of corrected ECC sectors regarding each of the first data and the second data.

10. The method of claim 9, wherein the performing of the soft decision at one of the read level at which the first data is read and the read level at which the second data is read comprises, when the number of ECC sectors corrected from the first data and the number of ECC sectors corrected from the second data are the same, selecting the read level for the soft decision based on the number of average iteration regarding each of the first data and the second data.

11. The method of claim 7, further comprising:
   performing ECC decoding on pieces of data that are read at read levels of the other indexes of the read retry table; and
   performing the soft decision at a read level that is selected based on the ECC decoding result of the first data, the ECC decoding result of the second data, and an ECC decoding result of the pieces of data that are read at read levels of the other indexes of the read retry table.

12. The method of claim 11, wherein the performing of ECC decoding on pieces of data that are read at read levels of the other indexes of the read retry table comprises performing ECC decoding on data stored in the second latch via the first latch while one of the pieces of data is transmitted to the first latch.

13. The method of claim 7, further comprising:
   setting a read level included in one of the indexes of the read retry table to a read level for starting the read retry by referring to a wear-out table in which each of the blocks of the flash memory is used as an index; and
   repeatedly performing the read retry at read levels in a range from the read level for starting the read retry to the last read level of the last index of the read retry table; and
   wherein the read method is performed when a read error during initial read is not corrected by performing read retry.

14. The method of claim 13, wherein the read retry table is selected from read retry tables that are differently provided for each endurance state period of the flash memory.

15. The method of claim 14, wherein the wear-out table updates wear-out information regarding a first block of the flash memory based on state information that is detected from the flash memory in response to a first command transmitted from the memory controller.

16. The method of claim 15, wherein the read level for starting the read retry at a current request of read retry on the first block of the flash memory comprises a read level of which a read error is corrected at a previous request of read retry on the first block of the flash memory.

17. The method of claim 16, wherein information regarding an index comprising a read level of which a read error is corrected at the previous request of read retry among the indexes of the read retry table is included in an index corresponding to the first block of the wear-out table.

18. The method of claim 15, wherein the first command comprises an erase command, and the flash memory transmits an incremental step pulse erase (ISPE) loop count value that is required for erasing a selected block in response to the erase command and that is represented as wear-out of the selected block, to the memory controller.

19. A solid state drive (SSD) that performs a data read operation by using the read method of claim 7.

* * * * *